United States Patent
Im et al.

(10) Patent No.: US 10,819,357 B2
(45) Date of Patent: Oct. 27, 2020

(54) PHASE DETECTION CIRCUIT, AND CLOCK GENERATION CIRCUIT AND SEMICONDUCTOR APPARATUS INCLUDING THE PHASE DETECTION CIRCUIT

(71) Applicant: SK hynix Inc., Icheon-si, Gyeonggi-do (KR)

(72) Inventors: Da In Im, Icheon-si Gyeonggi-do (KR); Young Suk Seo, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/850,738

(22) Filed: Apr. 16, 2020

(65) Prior Publication Data

US 2020/0244276 A1   Jul. 30, 2020

Related U.S. Application Data

(63) Continuation of application No. 16/434,660, filed on Jun. 7, 2019, now Pat. No. 10,637,488.

(30) Foreign Application Priority Data

Nov. 5, 2018 (KR) .......................... 10-2018-0134545

(51) Int. Cl.
| | | |
|---|---|---|
| *H03L 7/08* | (2006.01) | |
| *H03L 7/089* | (2006.01) | |
| *H03L 7/18* | (2006.01) | |
| *G06F 1/08* | (2006.01) | |
| *G06F 1/10* | (2006.01) | |

(52) U.S. Cl.
CPC ................ *H03L 7/18* (2013.01); *G06F 1/10* (2013.01); *H03L 7/089* (2013.01)

(58) Field of Classification Search
CPC ..... H03L 7/081; H03L 7/0814; H03L 7/0816; H03L 7/085; H03L 7/087; H03L 7/095; H03L 7/097; G06F 1/04; G06F 1/06; G06F 1/08

See application file for complete search history.

(56) References Cited

U.S. PATENT DOCUMENTS

| | | | |
|---|---|---|---|
| 6,587,534 B2 * | 7/2003 | Hassoun | G06F 1/10 327/156 |
| 7,010,014 B1 * | 3/2006 | Percey | G06F 1/10 327/158 |
| 7,605,623 B2 | 10/2009 | Yun et al. | |
| 7,755,405 B2 | 7/2010 | Yun et al. | |
| 7,848,266 B2 | 12/2010 | Man et al. | |
| 8,330,512 B2 | 12/2012 | Kim et al. | |
| 8,405,437 B2 | 3/2013 | Kim | |

FOREIGN PATENT DOCUMENTS

CN   102148616 A   8/2011

\* cited by examiner

*Primary Examiner* — An T Luu
(74) *Attorney, Agent, or Firm* — William Park & Associates Ltd.

(57) ABSTRACT

A phase detection circuit is configured to receive an input clock signal and a reference clock signal. The phase detection circuit is configured to generate a divided clock signal from the reference clock signal. The phase detection circuit is configured to generate a phase detection signal after comparing the phase of the input clock signal with the divided clock signal.

15 Claims, 7 Drawing Sheets

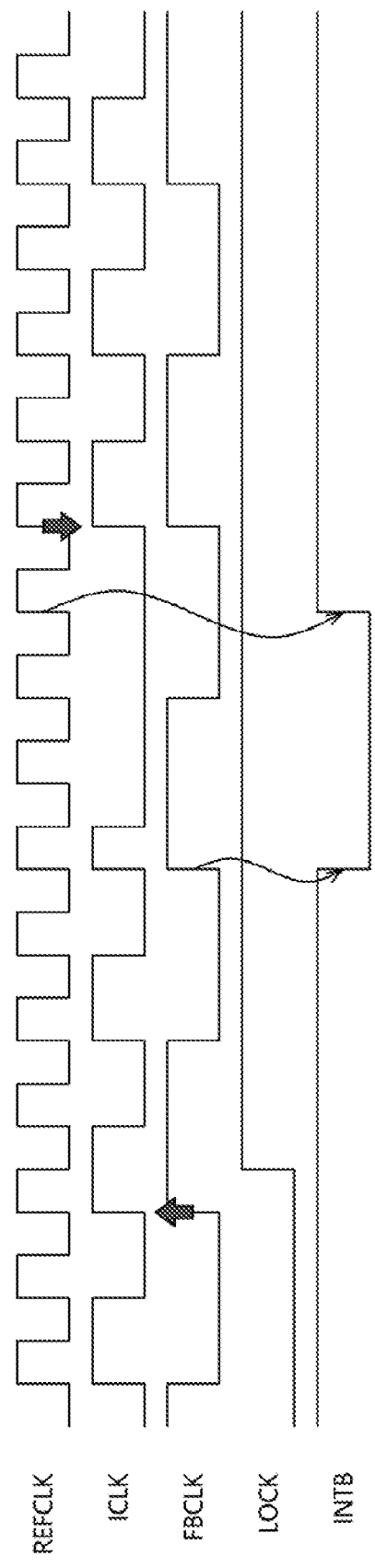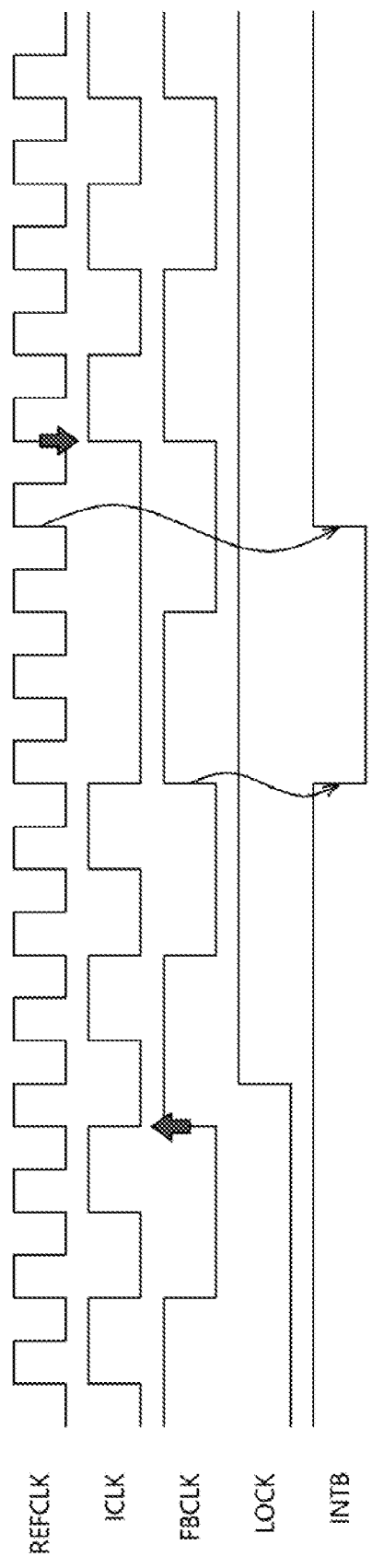

PHASE DETECTION CIRCUIT, AND CLOCK GENERATION CIRCUIT AND SEMICONDUCTOR APPARATUS INCLUDING THE PHASE DETECTION CIRCUIT

CROSS-REFERENCES TO RELATED APPLICATION

The present application is a continuation application of U.S. patent application Ser. No. 16/434,660, filed on Jun. 7, 2019, and claims priority under 35 U.S.C. § 119(a) to Korean application number 10-2018-0134545, filed on Nov. 5, 2018, in the Korean Intellectual Property Office, which is incorporated herein by reference in its entirety.

BACKGROUND

1. Technical Field

Various embodiments generally relate to an integrated circuit technology, and more particularly, to a phase detection circuit for detecting the phase of a clock signal, and a semiconductor apparatus including the phase detection circuit.

2. Related Art

An electronic device may include many electronic components. Among the electronic components, a computer system may include a large number of semiconductor apparatuses composed of semiconductors. The semiconductor apparatuses constituting the computer system may communicate with one another while transferring and receiving a clock signal and data. The semiconductor apparatuses may operate in synchronization with the clock signal. The semiconductor apparatuses may receive a system clock signal transferred through a clock bus, and generate an internal clock signal which can be used for an internal operation. The semiconductor apparatuses may include a clock generation circuit such as a delay locked loop (DLL) circuit and/or a phase locked loop (PLL) circuit, in order to synchronize the phases of the system clock signal and the internal clock signal. The clock generation circuits include a phase detection circuit, and the phase detection circuit detects whether the phase of the clock signal leads or lags, such that the phase of the clock signal can be adjusted.

SUMMARY

In an embodiment, a phase detection circuit may include a clock divider, a unit delay, a first phase detector, a second phase detector, and an initialization signal generator. The clock divider may be configured to generate a divided clock signal by dividing the frequency of a reference clock signal, and is initialized based on an initialization signal. The first phase detector may be configured to generate a first detection signal by comparing the phase of an input clock signal, after being delayed by a unit delay time, with the phase of the divided clock signal. The second phase detector may be configured to generate a second detection signal by comparing the phase of the input clock signal to the phase of the divided clock signal. The initialization signal generator may be configured to generate the initialization signal based on the first detection signal.

In an embodiment, a clock generation circuit may include a phase detection circuit. The phase detection circuit may be configured to generate an output clock signal by delaying a reference clock signal, and to generate a phase detection signal by detecting the phases of the reference clock signal and a feedback clock signal generated from the output clock signal in order to change a delay amount of the output clock signal. The phase detection circuit may include a clock divider, a unit delay, a first phase detector, a second phase detector, and an output selector. The clock divider may be configured to generate a divided clock signal by dividing the reference clock signal. The unit delay may be configured to delay the feedback clock signal by a unit delay time. The first phase detector may be configured to generate a first detection signal by comparing the phase of an output of the unit delay to the phase of the divided clock signal during a first delay locking operation. The second phase detector may be configured to generate a second detection signal by comparing the phase of the feedback clock signal to the phase of the divided clock signal during a second delay locking operation. The output selector may be configured to output one of the first and second detection signals as the phase detection signal based on a locking signal.

In an embodiment, a phase detection circuit may include a clock divider, a select signal generator, and a phase detector. The clock divider may be configured to generate a first divided clock signal, a second divided clock signal and a third divided clock signal by dividing a reference clock signal. The select signal generator may be configured to generate a select signal by comparing the second divided clock signal and an input clock signal based on a locking signal. The phase detector may be configured to generate a phase detection signal by comparing the phase of the first divided clock signal to the phase of the input clock signal when the select signal is at a first level, and generate the phase detection signal by comparing the phase of the third divided clock signal to the phase of the input clock signal when the select signal is at a second level.

In an embodiment, a clock generation circuit may include a phase detection circuit. The phase detection circuit may be configured to generate an output clock signal by delaying a reference clock signal, and generate a phase detection signal by detecting the phase of the reference clock signal to the phase of a feedback clock signal generated from the output clock signal in order to change a delay amount of the output clock signal. The phase detection circuit may include a clock divider, a select signal generator, and a phase detector. The clock divider may be configured to generate a first divided clock signal, a second divided clock signal and a third divided clock signal by dividing the reference clock signal. The select signal generator may be configured to generate a select signal by comparing the phase of the second divided clock signal to the phase of a feedback clock signal based on a locking signal. The phase detector may be configured to generate a phase detection signal by comparing the phase of one of the first and third divided clock signals to the phase of the feedback clock signal based on the select signal.

In an embodiment, a phase detection circuit may include a clock divider configured to generate a divided clock signal by dividing the frequency of a reference clock signal during a first delay locking operation. The phase detection circuit may include a first phase detector configured to compare the phase of an input clock signal, which has been delayed by a unit delay time, to the phase of the divided clock signal during the first delay locking operation. The phase detection circuit may include a second phase detector configured to compare the phase of the divided clock signal to the phase of the input clock signal during a second delay locking operation. The clock divider may be initialized after completion of the first delay locking operation.

BRIEF DESCRIPTION OF THE DRAWINGS

FIGS. 4A and 4B are timing diagrams illustrating operations of the phase detection circuit and the clock generation circuit in accordance with an embodiment.

DETAILED DESCRIPTION

Figure 1:
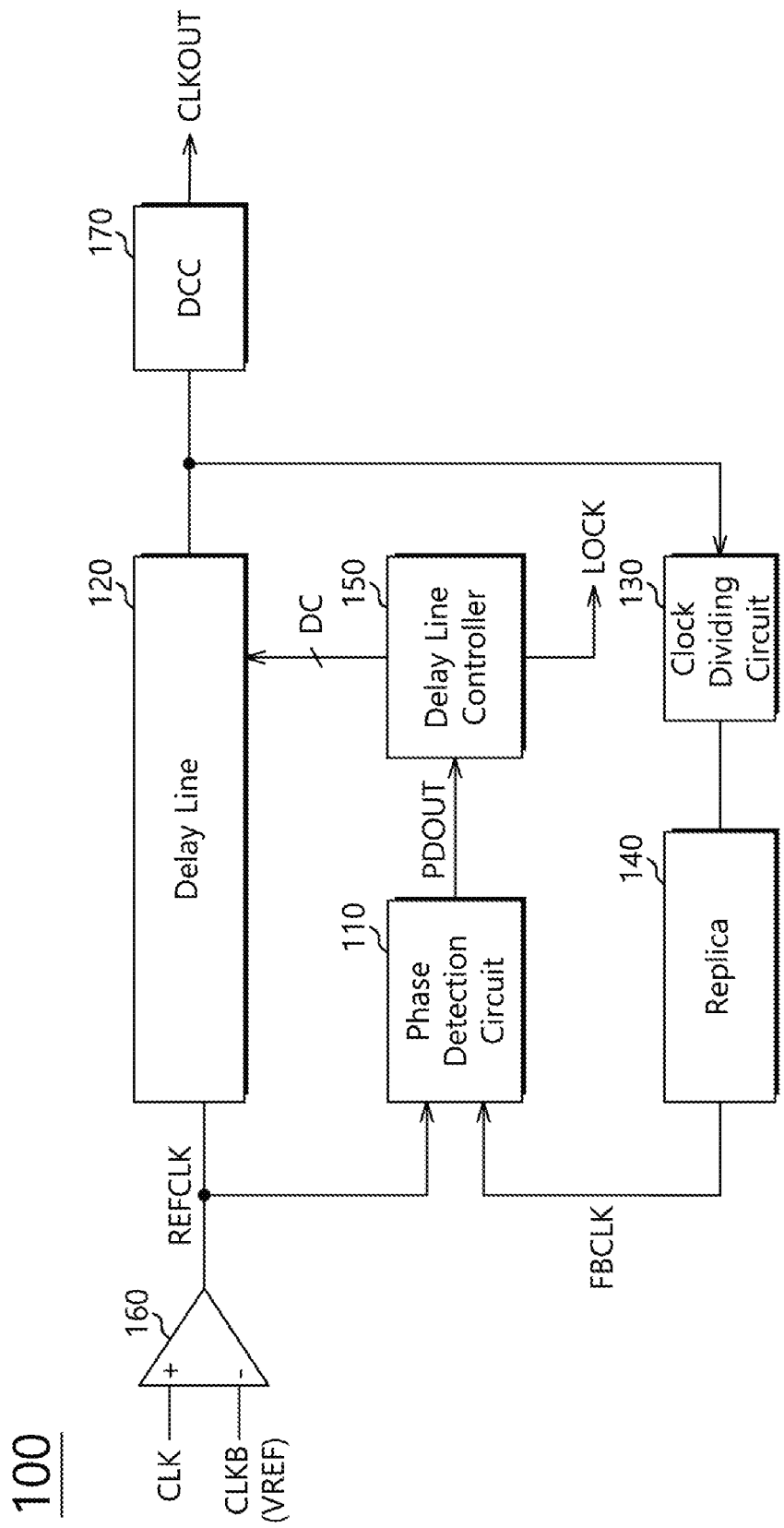
FIG. 1 illustrates a configuration of a clock generation circuit in accordance with an embodiment.

FIG. 1 illustrates a configuration of a clock generation circuit 100 in accordance with an embodiment. The clock generation circuit 100 may receive a system clock signal CLK and generate an output clock signal CLKOUT. The system clock signal CLK may be an external clock signal transferred from an external device of a semiconductor apparatus including the clock generation circuit 100. The clock generation circuit 100 may generate the output clock signal CLKOUT by delaying a reference clock signal REFCLK generated from the system clock signal CLK. The clock generation circuit 100 may be a delay locked loop (DLL) circuit that can change a delay amount of the output clock signal CLKOUT, and maintain the changed delay amount. The clock generation circuit 100 may include a phase detection circuit 110 to change the phase of the output clock signal CLKOUT. The phase detection circuit 110 may generate a phase detection signal PDOUT by comparing the phase of the reference clock signal REFCLK to the phase of a feedback clock signal FBCLK generated by delaying the output clock signal CLKOUT.

In FIG. 1, the clock generation circuit 100 may include a delay line 120, a clock dividing circuit 130, a replica 140 and a delay line controller 150. The delay line 120 may generate the output clock signal CLKOUT by delaying the reference clock signal REFCLK. The delay line 120 may receive a delay control signal DC, and have a delay amount which is changed based on the delay control signal DC. The delay line 120 may generate the output clock signal CLKOUT by delaying the reference clock signal REFCLK by a delay amount which is set based on the delay control signal DC.

The clock dividing circuit 130 may receive the output clock signal CLKOUT. The clock dividing circuit 130 may generate a divided clock signal by dividing the output clock signal CLKOUT. For example, the clock dividing circuit 130 may divide the frequency of the output clock signal CLKOUT. The clock dividing circuit 130 may generate a clock signal having a half frequency of the output clock signal CLKOUT. The replica 140 may receive an output of the clock dividing circuit 130. The replica 140 may delay the output of the clock dividing circuit 130 by a preset delay amount. The replica 140 may generate the feedback clock signal by delaying the output of the clock dividing circuit 130. The delay amount of the replica 140 may be arbitrarily set. For example, the delay amount of the replica 140 may correspond to a delay time required until the semiconductor apparatus including the clock generation circuit 100 receives the system clock signal CLK and generates the reference clock signal REFCLK. The word "preset" as used herein with respect to a parameter, such as a preset delay amount, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The phase detection circuit 110 may receive the reference clock signal REFCLK and the feedback clock signal FBCLK. The phase detection circuit 110 may generate a divided clock signal by dividing the reference clock signal REFCLK. The phase detection circuit 110 may generate a divided clock signal having a half frequency of the reference clock signal REFCLK by dividing the frequency of the reference clock signal REFCLK. In an embodiment, the phase detection circuit 110 may generate a plurality of divided clock signals having different phases by dividing the reference clock signal REFCLK. The phase detection circuit 110 may generate the phase detection signal PDOUT by comparing the phase of the divided clock signal to the phase of the feedback clock signal FBCLK.

The delay line controller 150 may receive the phase detection signal PDOUT. The delay line controller 150 may generate the delay control signal DC based on the phase detection signal PDOUT. The delay control signal DC may be a code signal having a plurality of bits. The delay line 120 may include a plurality of unit delays. The plurality of unit delays may be controlled based on the respective bits of the delay control signal DC. The delay line controller 150 may increase the delay amount of the delay line 120 by increasing the code value of the delay control signal DC and increasing the number of turned-on unit delays. Furthermore, the delay line controller 150 may decrease the delay amount of the delay line 120 by decreasing the code value of the delay control signal DC and decreasing the number of turned-on unit delays.

For example, the phase detection circuit 110 may generate the phase detection signal PDOUT having a first level when the phase of the reference clock signal RFFCLK lags behind the phase of the feedback clock signal FBCLK. The first level may be a logic low level. The phase detection circuit 110 may generate the phase detection signal PDOUT having a second level when the phase of the reference clock signal RFFCLK leads the phase of the feedback clock signal FBCLK. The second level may be a logic high level. When the phase detection signal PDOUT is at the first level, the delay line controller 150 may decrease the delay amount of the delay line 120 by decreasing the code value of the delay control signal DC. When the phase detection signal PDOUT is at the second level, the delay line controller 150 may increase the delay amount of the delay line 120 by increasing the code value of the delay control signal DC. A high level and a low level, as used herein with respect to signals, refer to logic levels of the signals. A signal having a low level distinguishes from the signal when it has a high level. For example, the high level may correspond to the signal having a first voltage, and the low level may correspond to the signal having a second voltage. For some embodiments, the first voltage is greater than the second voltage. In other embodiments, different characteristics of a signal, such as frequency or amplitude, determine whether the signal has a high level or a low level. For some cases, the high and low levels of a signal represent logical binary states.

The delay line controller 150 may generate a locking signal LOCK based on the phase detection signal PDOUT. The delay line controller 150 may enable the locking signal LOCK when the phase detection signals PDOUT having different levels are successively generated from the phase detection circuit 110. The locking signal LOCK may indicate that a delay locking operation is completed. For example, when the phase detection signal PDOUT having a high level is generated from the phase detection circuit 110 after the phase detection signal PDOUT having a low level is generated or the phase detection signal PDOUT having a low level is generated from the phase detection circuit 110 after the phase detection signal PDOUT having a high level is generated, the delay line controller 150 may enable the locking signal LOCK. A high level and a low level, as used herein with respect to signals, refer to logic levels of the signals. A signal having a low level distinguishes from the signal when it has a high level. For example, the high level may correspond to the signal having a first voltage, and the low level may correspond to the signal having a second voltage. For some embodiments, the first voltage is greater than the second voltage. In other embodiments, different characteristics of a signal, such as frequency or amplitude, determine whether the signal has a high level or a low level. For some cases, the high and low levels of a signal represent logical binary states.

In FIG. 1, the clock generation circuit 100 may further include a clock buffer 160 and a duty correction circuit (DCC) 170. The clock buffer 160 may receive the system clock signal CLK and generate the reference clock signal REFCLK. The system clock signal CLK may be inputted as a single ended signal, or inputted as a differential signal with a complementary signal CLKB. When the system clock signal CLK is inputted as a single ended signal, the clock buffer 160 may generate the reference clock signal REFCLK by differentially amplifying the system clock signal CLK and a reference voltage VREF. The reference voltage VREF may have a level corresponding to the middle of the swing of the system clock signal CLK. When the system clock signal CLK is inputted as a differential signal, the clock buffer 160 may generate the reference clock signal REFCLK by differentially amplifying the system clock signal CLK and the complementary signal CLKB. The DCC 170 may be coupled to the delay line 120. The DCC 170 may correct the duty ratio of the output clock signal CLKOUT. For example, the DCC 170 may correct the duty ratio of the output clock signal CLKOUT such that the output clock signal CLKOUT may have a duty ratio of 50:50. The word "coupled," as used herein for some embodiments, means that two components are directly connected with one another. For example, a first component coupled to a second component means the first component is contacting the second component. For other embodiments, coupled components have one or more intervening components. For example, a first component is coupled to a second component when the first and second components are both in contact with a common third component even though the first component is not directly contacting the second component.

The clock generation circuit 100 may perform a first delay locking operation and a second delay locking operation. The first delay locking operation may be a coarse delay locking operation, and the second delay locking operation may be a fine delay locking operation. The unit delay amount of the delay line 120 in the first delay locking operation may be changed by a larger amount than the unit delay amount of the delay line 120 in the second delay locking operation. For example, during the first delay locking operation, the delay amount of the delay line 120 may be changed by a first unit delay time, and during the second delay locking operation, the delay amount of the delay line 120 may be changed by a second unit delay time. The first unit delay time may be longer than the second unit delay time. The clock generation circuit 100 may generate the output clock signal CLKOUT by performing the first delay locking operation. When the first delay locking operation is completed, the clock generation circuit 100 may generate the output clock signal CLKOUT by performing the second delay locking operation. When the first delay locking operation is completed, the locking signal LOCK may be enabled by the delay line controller 150.

Figure 2:
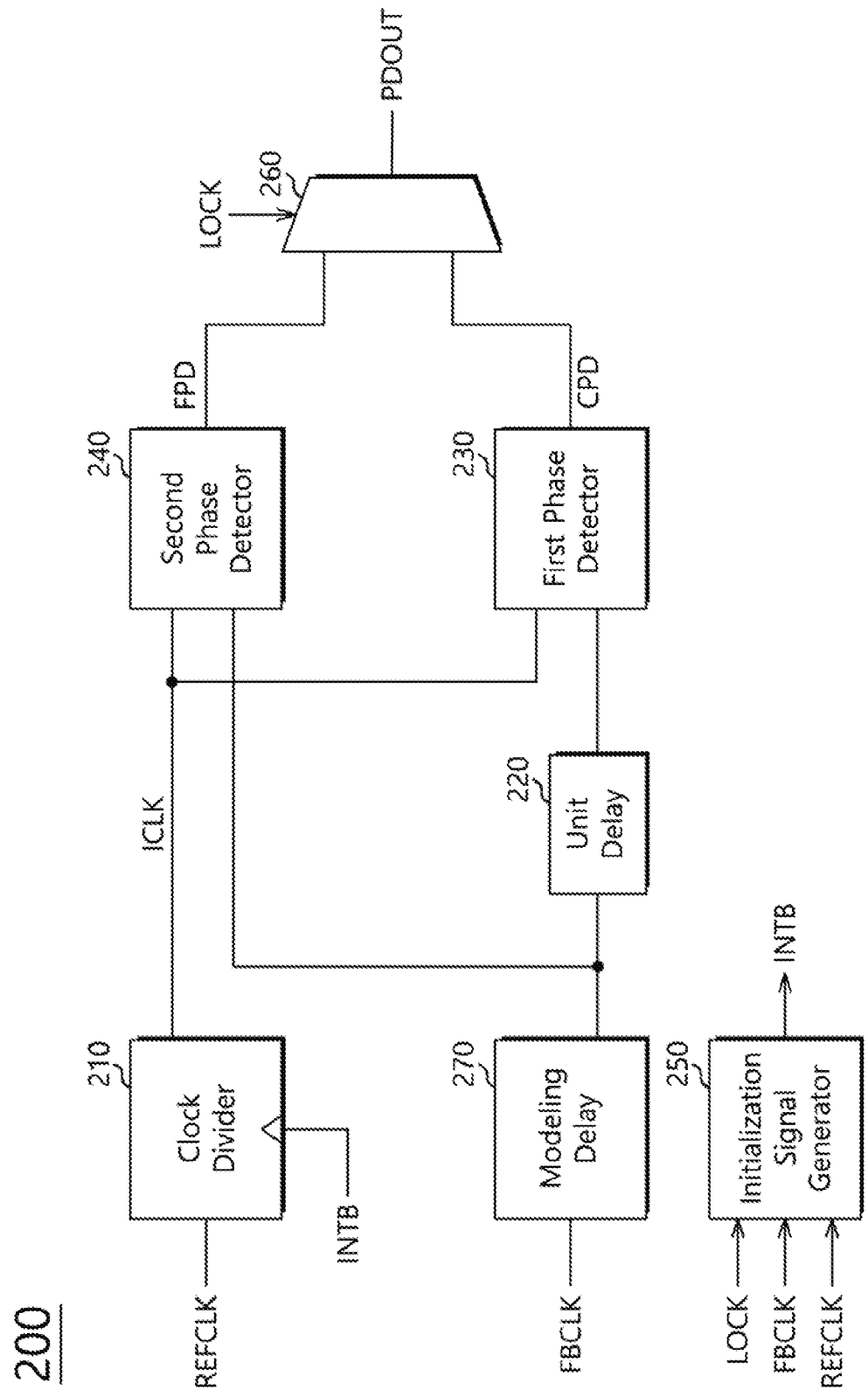
FIG. 2 illustrates a configuration of a phase detection circuit in accordance with an embodiment.

FIG. 2 illustrates a configuration of a phase detection circuit 200 in accordance with an embodiment. The phase detection circuit 200 may be applied as the phase detection circuit 110 illustrated in FIG. 1. The phase detection circuit 200 may generate a first detection signal CPD by comparing the phase of an input clock signal FBCLK to the phase of a divided clock signal ICLK generated by dividing the reference clock signal REFCLK during the first delay locking operation. The phase detection circuit 200 may generate a second detection signal FPD by comparing the phase of the divided clock signal ICLK to the phase of the input clock signal FBCLK during the second delay locking operation. The phase detection circuit 200 may output the first detection signal CPD as a phase detection signal PDOUT during the first delay locking operation, and output the second detection signal FPD as the phase detection signal PDOUT during the second delay locking operation. Referring to FIG. 2, the phase detection circuit 200 may include a clock divider 210, a unit delay 220, a first phase detector 230 and a second phase detector 240. The clock divider 210 may receive the reference clock signal REFCLK. The clock divider 210 may generate the divided clock signal ICLK by dividing the frequency of the reference clock signal REFCLK. The divided clock signal ICLK may have the same phase as the reference clock signal REFCLK.

The unit delay 220 may receive the input clock signal FBCLK. The input clock signal FBCLK may be a clock signal which is to be compared to the reference clock signal REFCLK. The input clock signal FBCLK may be a clock signal corresponding to the feedback clock signal FBCLK in FIG. 1. Hereafter, the input clock signal and the feedback clock signal may indicate the same clock signal. The unit delay 220 may delay the input clock signal FBCLK by a unit delay time, and output the delayed signal. The unit delay time may correspond to the first unit delay time corresponding to the unit delay amount of the delay line 120 when the clock generation circuit 100 of FIG. 1 performs the first delay locking operation.

The first phase detector 230 may receive the divided clock signal ICLK and the output of the unit delay 220. The first phase detector 230 may function as a phase detector that detects the phases of the reference clock signal REFCLK and the feedback clock signal FBCLK, when the first delay locking operation is performed. When the first delay locking operation is performed, the first phase detector 230 may detect whether a phase difference between the divided clock signal ICLK and the input clock signal FBCLK falls within the first unit delay time. The first phase detector 230 may generate the first detection signal CPD by comparing the phase of the divided clock signal ICLK to the phase of the output of the unit delay 220.

The second phase detector 240 may receive the divided clock signal ICLK and the input clock signal FBCLK. The second phase detector 240 may function as a phase detector that detects the phases of the divided clock signal ICLK and the feedback clock signal FBCLK, when the second delay locking operation is performed. When the second delay locking operation is performed, the second phase detector 240 may detect whether a phase difference between the divided clock signal ICLK and the input clock signal FBCLK falls within the second unit delay time. The second phase detector 240 may generate the second detection signal FPD by comparing the phase of the divided clock signal ICLK to the phase of the input clock signal FBCLK.

In FIG. 2, the phase detection circuit 200 may further include an initialization signal generator 250. The initialization signal generator 250 may generate an initialization signal INTB based on the phase detection signal PDOUT and the input clock signal FBCLK. The initialization signal generator 250 may receive the locking signal LOCK, the input clock signal FBCLK and the reference clock signal REFCLK, and generate the initialization signal INTB. The locking signal LOCK may be generated based on the phase detection signal PDOUT during the first delay locking operation. The locking signal LOCK may be generated based on the first detection signal CPD which is outputted as the phase detection signal PDOUT during the first delay locking operation. The locking signal LOCK may be a locked signal which is enabled when the first delay locking operation is completed. The initialization signal generator 250 may enable the initialization signal INTB in synchronization with the input clock signal FBCLK, when the locking signal LOCK is enabled. The initialization signal generator 250 may disable the initialization signal INTB in synchronization with the reference clock signal REFCLK. The clock divider 210 may receive the initialization signal INTB. The clock divider 210 may be initialized based on the initialization signal INTB. When initialized by the initialization signal INTB, the clock divider 210 may newly generate the divided clock signal ICLK synchronized with the phase of the reference clock signal REFCLK.

The phase detection circuit 200 may further include an output selector 260. The output selector 260 may receive the locking signal LOCK, the first detection signal CPD and the second detection signal FPD. The output selector 260 may output one of the first and second detection signals CPD and FPD as the phase detection signal PDOUT based on the locking signal LOCK. For example, when the locking signal LOCK is disabled, the output selector 260 may output the first detection signal CPD as the phase detection signal PDOUT. When the locking signal LOCK is enabled, the output selector 260 may output the second detection signal FPD as the phase detection signal PDOUT.

The phase detection circuit 200 may further include a modeling delay 270. The modeling delay 270 may have a delay amount obtained by modeling a delay amount which occurs in the clock divider 210. The modeling delay 270 may have a delay amount corresponding to the time required until the clock divider 210 receives the reference clock signal REFCLK and generates the divided clock signal ICLK. The modeling delay 270 may receive the input clock signal FBCLK, and delay the input clock signal FBCLK by the modeled delay amount. By delaying the input clock signal FBCLK by the delay amount of the clock divider 210, the modeling delay 270 may adjust the point of time when the divided clock signal ICLK and the input clock signal FBCLK are inputted to the first phase detector 230 and/or the second phase detector 240.

Figure 3:
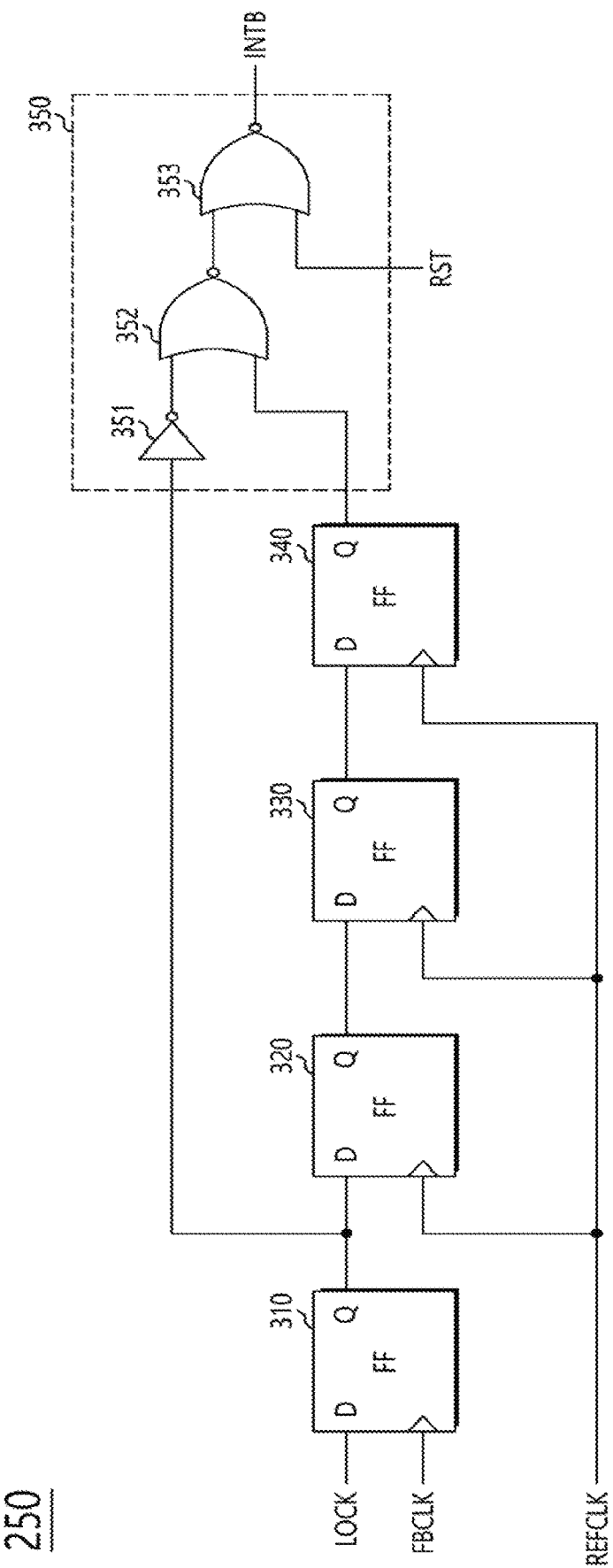
FIG. 3 illustrates a configuration of an initialization signal generator illustrated in FIG. 2.

FIG. 3 illustrates a configuration of the initialization signal generator 250 illustrated in FIG. 2. In FIG. 3, the initialization signal generator 250 may receive the locking signal LOCK, the input clock signal FBCLK and the reference clock signal REFCLK. The initialization signal generator 250 might not enable the initialization signal INTB, when the locking signal LOCK is disabled. The initialization signal generator 250 may enable the initialization signal INTB in synchronization with the input clock signal FBCLK, when the locking signal LOCK is enabled. The initialization signal generator 250 may disable the initialization signal INTB in synchronization with the reference clock signal REFCLK. The initialization signal generator 250 may maintain the enabled state of the initialization signal INTB during an arbitrary cycle of the reference clock signal REFCLK, based on the reference clock signal REFCLK.

The initialization signal generator 250 may include a first flip-flop 310, a second flip-flop 320, a third flip-flop 330, a fourth flip-flop 340 and a pulse generator 350. The first flip-flop 310 may receive the locking signal LOCK through an input terminal thereof, and receive the input clock signal FBCLK through a clock terminal thereof. The first flip-flop 310 may output the locking signal LOCK to an output terminal thereof in synchronization with the input clock signal FBCLK. The second flip-flop 320 may have an input terminal coupled to the output terminal of the first flip-flop 310 and a clock terminal configured to receive the reference clock signal REFCLK. The second flip-flop 320 may output a signal inputted through the input terminal to an output terminal thereof in synchronization with the reference clock signal REFCLK. The third flip-flop 330 may have an input terminal coupled to the output terminal of the second flip-flop 320 and a clock terminal configured to receive the reference clock signal REFCLK. The third flip-flop 330 may output a signal inputted through the input terminal to an output terminal thereof in synchronization with the reference clock signal REFCLK. The fourth flip-flop 340 may have an input terminal coupled to the output terminal of the third flip-flop 330 and a clock terminal configured to receive the reference clock signal REFCLK. The fourth flip-flop 340 may output a signal inputted through the input terminal to an output terminal thereof in synchronization with the reference clock signal REFCLK.

The pulse generator 350 may receive the signal outputted from the output terminal of the first flip-flop 310 and the signal outputted from the output terminal of the fourth flip-flop 340, and generate the initialization signal INTB. The pulse generator 350 may enable the initialization signal INTB based on the signal outputted from the output terminal of the first flip-flop 310, and disable the initialization signal INTB based on the signal outputted from the output terminal of the fourth flip-flop 340. The initialization signal generator 250 may be modified in various manners to include various numbers of flip-flops. In FIG. 3, the initialization signal generator 250 may include second to fourth flip-flops 320, 330 and 340 to generate the initialization signal INTB having a pulse width within three cycles of the reference clock signal REFCLK. The number of flip-flops included in the initialization signal generator 250 may be changed to make the initialization signal INTB have a pulse width within two cycles of the reference clock signal REFCLK or a pulse width within four cycles of the reference clock signal REFCLK.

The pulse generator 350 may be configured to perform inversion and OR operations and may include, for example but not limited to, an inverter 351, a first NOR gate 352 and a second NOR gate 353. The inverter 351 may receive a signal outputted from the output terminal of the first flip-flop 310, and invert the received signal. The first NOR gate 352 may receive the output of the inverter 351 and a signal outputted from the fourth flip-flop 340, and perform a NOR operation on the received signals. The second NOR gate 353 may receive an output of the first NOR gate 352 and a reset signal RST, and output the initialization signal INTB. The second NOR gate 353 may generate the initialization signal INTB by inverting the output of the first NOR gate 352. The reset signal RST may be received to reset the initialization signal generator 250. When the reset signal RST is disabled, the second NOR gate 353 may operate as an inverter.

FIGS. 4A and 4B are timing diagrams illustrating the operations of the phase detection circuit 200 and the clock generation circuit 100 in accordance with an embodiment. Referring to FIGS. 1 to 4B, the operations of the phase detection circuit 200 and the clock generation circuit 100 in accordance with an embodiment will be described as follows. The clock generation circuit 100 may receive the system clock signal CLK and perform the first delay locking operation. The clock divider 210 may generate the divided clock signal ICLK by dividing the frequency of the reference clock signal REFCLK. The first phase detector 230 may generate the first detection signal CPD by comparing the phase of the feedback clock signal FBCLK delayed by the unit delay 220 to the phase of the divided clock signal ICLK. The locking signal LOCK may be disabled, and the output selector 260 may output the first detection signal CPD as the phase detection signal PDOUT. The delay line controller 150 may change the code value of the delay control signal DC based on the phase detection signal PDOUT, and the delay line 120 may change the phases of the output clock signal CLKOUT and the feedback clock signal FBCLK. When the phase detection signals PDOUT having different levels are successively generated from the phase detection circuit 200, the delay line controller 150 may enable the locking signal LOCK to complete the first delay locking operation.

When the locking signal LOCK is enabled, the initialization signal generator 250 may enable the initialization signal INTB in synchronization with the feedback clock signal FBCLK. When the initialization signal INTB is enabled, the clock divider 210 might not output the divided clock signal ICLK. When the initialization signal INTB is disabled, the clock generation circuit 100 may perform the second delay locking operation. When the initialization signal INTB is disabled, the clock divider 210 may newly generate the divided clock signal ICLK from the reference clock signal REFCLK. The second phase detector 240 may generate the second detection signal FPD by comparing the phase of the divided clock signal ICLK to the phase of the feedback clock signal FBCLK. The output selector 260 may output the second detection signal FPD as the phase detection signal PDOUT based on the locking signal LOCK, and the delay line controller 150 may change the code value of the delay control signal DC based on the second detection signal FPD outputted as the phase detection signal PDOUT. Based on the delay control signal DC, the delay amount of the delay line 120 may be finely adjusted, and the second delay locking operation may be performed.

As illustrated in FIG. 4A, when the phase of the feedback clock signal FBCLK is adjusted to be synchronized with a rising edge of the divided clock signal ICLK during the first delay locking operation, harmonic locking might not occur during the second delay locking operation. As illustrated in FIG. 4B, however, when the phase of the feedback clock signal FBCLK is adjusted to be synchronized with a falling edge of the divided clock signal ICLK during the first delay locking operation, harmonic locking may occur during the second delay locking operation. That is, while the feedback clock signal FBCLK is not synchronized with a rising edge of the divided clock signal ICLK, the first delay locking operation may be completed. The phase detection circuit 200 may initialize the clock divider 210 to solve the problem of the harmonic locking. The initialization signal generator 250 may enable the initialization signal INTB in synchronization with the feedback clock signal FBCLK, but disable the initialization signal INTB in synchronization with the reference clock signal REFCLK. Therefore, because the clock divider 210 newly generates the divided clock signal ICLK based on the initialization signal INTB, the second phase detector 240 may generate the second detection signal FPD by performing a phase comparison operation on a rising edge of the feedback clock signal FBCLK and a rising edge of the divided clock signal ICLK.

Referring to FIG. 4A, the initialization signal INTB may be enabled in synchronization of a rising edge of the feedback clock signal FBCLK, and disabled in synchronization with a rising edge of the reference clock signal REFCLK. When the initialization signal INTB is disabled, the clock divider 210 may newly generate the divided clock signal ICLK based on the reference clock signal REFCLK. Therefore, during the second delay locking operation, the phases of the rising edge of the feedback clock signal FBCLK and the rising edge of the divided clock signal ICLK may be compared to each other. Referring to FIG. 4B, a rising edge of the feedback clock signal FBCLK may be synchronized with a falling edge of the divided clock signal ICLK during the first delay locking operation. At this time, when the clock divider 210 is not initialized, the phases of the rising edge of the feedback clock signal FBCLK and the falling edge of the divided clock signal ICLK may be compared to each other during the second delay locking operation. In this case, harmonic locking may occur. However, when the clock divider 210 is initialized to newly generate the divided clock signal ICLK, the phases of the rising edge of the feedback clock signal FBCLK and the rising edge of the divided clock signal ICLK may be compared to each other during the second delay locking operation.

Figure 5:
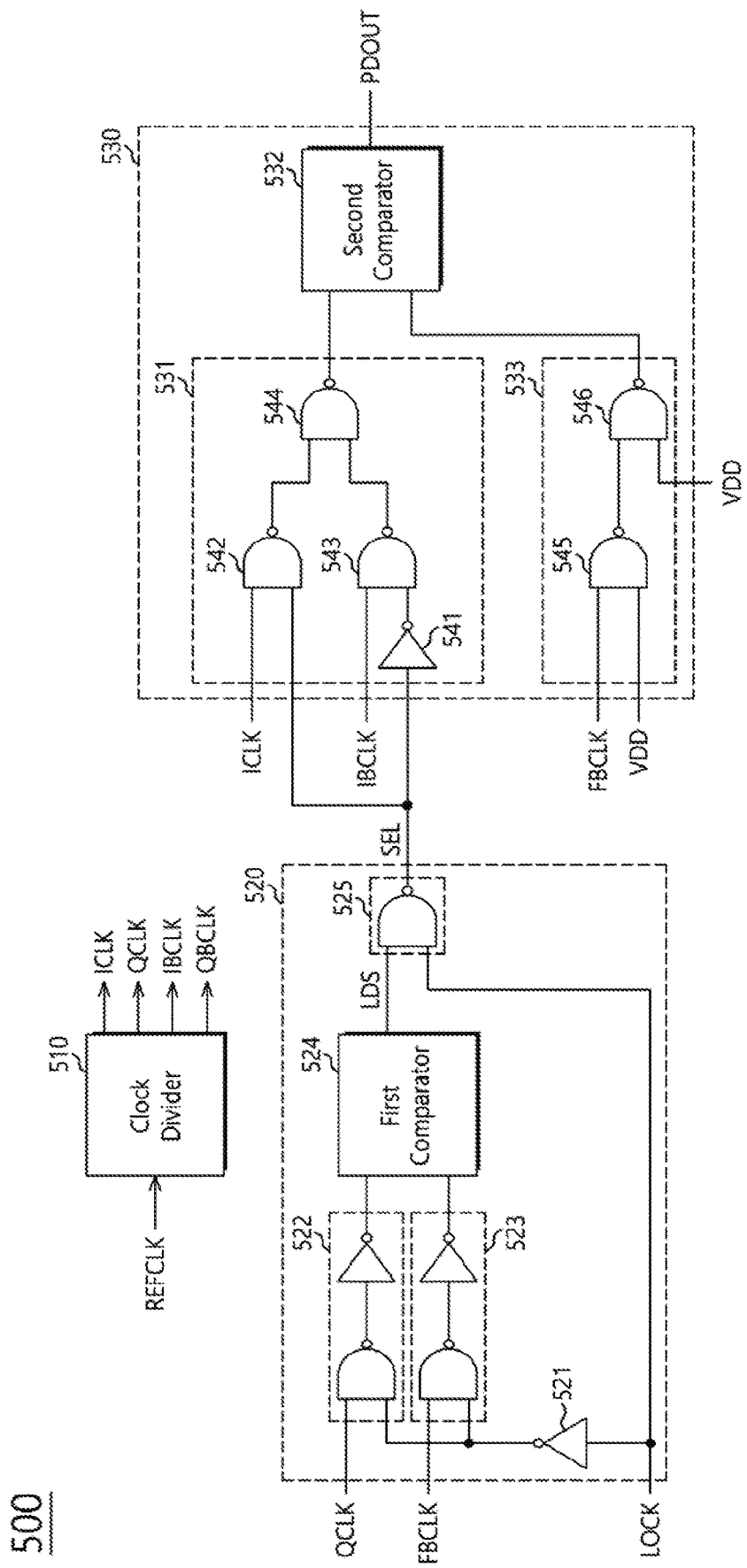
FIG. 5 illustrates a configuration of a phase detection circuit in accordance with an embodiment.

FIG. 5 illustrates a configuration of a phase detection circuit 500 in accordance with an embodiment. Referring to FIG. 5, the phase detection circuit 500 may include a clock divider 510, a select signal generator 520 and a phase detector 530. The clock divider 510 may receive a reference clock signal REFCLK, and generate a plurality of divided clock signals ICLK, QCLK, IBCLK and QBCLK. The clock divider 510 may generate a first divided clock signal ICLK, a second divided clock signal QCLK, a third divided clock signal IBCLK and a fourth divided clock signal QBCLK by dividing the frequency of the reference clock signal REFCLK. For example, the first to fourth divided clock signals ICLK, QCLK, IBCLK and QBCLK may have a half frequency of the reference clock signal REFCLK. The first to fourth divided clock signals ICLK, QCLK, IBCLK and QBCLK may sequentially have a phase difference corresponding to a unit phase. The first to fourth divided clock signals ICLK, QCLK, IBCLK and QBCLK may sequentially have a phase difference of 90 degrees. The second divided clock signal QCLK may have a phase corresponding to the middle between the first and third divided clock signals ICLK and IBCLK.

The select signal generator 520 may receive the input clock signal FBCLK, the second divided clock signal QCLK and the locking signal LOCK. The input clock signal FBCLK may be a signal corresponding to the feedback clock signal FBCLK illustrated in FIG. 1. The select signal generator 520 may generate a select signal SEL by comparing the phase of the second divided clock signal QCLK to the phase of the input clock signal FBCLK based on the locking signal LOCK. When the locking signal LOCK is disabled during the first delay locking operation, the select signal generator 520 may generate the select signal SEL having a first level regardless of the phases of the second divided clock signal QCLK and the input clock signal FBCLK. Furthermore, the select signal generator 520 may generate a level decision signal LDS by comparing the phase of the second divided clock signal QCLK to the phase of the input clock signal FBCLK. The select signal generator 520 may generate the level decision signal LDS having the first level, when the second divided clock signal QCLK has the first level at a rising edge of the input clock signal FBCLK. The select signal generator 520 may generate the level decision signal LDS having a second level, when the second divided clock signal QCLK has the second level at a rising edge of the input clock signal FBCLK. When the locking signal LOCK is enabled during the second delay locking operation, the select signal generator 520 may output the level decision signal LDS as the select signal SEL.

The phase detector 530 may receive the select signal SEL, the first divided clock signal ICLK, the third divided clock signal IBCLK and the input clock signal FBCLK. The phase detector 530 may generate a phase detection signal PDOUT by comparing the phase of one of the first and third divided clock signals ICLK and IBCLK to the phase of the input clock signal FBCLK, based on the select signal SEL. The phase detector 530 may generate the phase detection signal PDOUT by comparing the phase of the first divided clock signal ICLK to the phase of the input clock signal FBCLK, when the select signal SEL is at the first level. The phase detector 530 may generate the phase detection signal PDOUT by comparing the phase of the third divided clock signal IBCLK to the phase of the input clock signal FBCLK, when the select signal SEL is at the second level.

The select signal generator 520 may include an inverter 521, a first gating unit 522, a second gating unit 523, a first comparator 524 and a third gating unit 525. The inverter 521 may receive the locking signal LOCK and invert the locking signal LOCK. The first gating unit 522 may receive the second divided clock signal QCLK and the output of the inverter 521. The first gating unit 522 may perform an AND operation the second divided clock signal QCLK and the output of the inverter 521. The second gating unit 523 may receive the input clock signal FBCLK and the output of the inverter 521. The second gating unit 523 may perform an AND operation the input clock signal FBCLK and the output of the inverter 521. The first comparator 524 may receive outputs of the first and second gating units 522 and 523, and output the level decision signal LDS. The first comparator 524 may generate the level decision signal LDS by comparing the phases of the outputs of the first and second gating units 522 and 523. The first comparator 524 may include a flip-flop. The first comparator 524 may output the output of the first gating unit 522 as the level decision signal LDS in synchronization with the output of the second gating unit 523. The third gating unit 525 may receive the level decision signal LDS and the locking signal LOCK, and output the select signal SEL. The third gating unit 525 may generate the select signal SEL by performing a NAND operation on the level decision signal LDS and the locking signal LOCK.

The phase detector 530 may include a clock selector 531 and a second comparator 532. The clock selector 531 may receive the select signal SEL, the first divided clock signal ICLK and the third divided clock signal IBCLK. The clock selector 531 may output one of the first and third divided clock signals ICLK and IBCLK to the second comparator 532 based on the select signal SEL. The clock selector 531 may be configured to perform inversion and AND operations and may include, for example but not limited to, an inverter 541, a first NAND gate 542, a second NAND gate 543 and a third NAND gate 544. The inverter 541 may receive the select signal SEL, and invert the select signal SEL. The first NAND gate 542 may receive the first divided clock signal ICLK and the select signal SEL, and perform a NAND operation on the first divided clock signal ICLK and the select signal SEL. The second NAND gate 543 may receive the third divided clock signal IBCLK and an output of the inverter 541, and perform a NAND operation on the third divided clock signal IBCLK and the output of the inverter 541. The second comparator 532 may receive the input clock signal FBCLK and the output of the clock selector 531, and output a phase detection signal PDOUT. The second comparator 532 may generate the phase detection signal PDOUT by comparing the phase of the input clock signal FBCLK to the phase of the output of the clock selector 531. The second comparator 532 may include a flip-flop. The second comparator 532 may output the output of the clock selector 531 as the phase detection signal PDOUT in synchronization with the input clock signal FBCLK.

The phase detector 530 may further include a dummy delay 533. The dummy delay 533 may delay the input clock signal FBCLK, and output the delayed signal to the second comparator 532. The dummy delay 533 may have a delay amount corresponding to a delay amount required for the clock selector 531 to select and output one of the first and third divided clock signals ICLK and IBCLK. The dummy delay 533 may be configured to perform an AND operation and may include, for example but not limited to, a fourth NAND gate 545 and a fifth NAND gate 546. The fourth NAND gate 545 may receive the input clock signal FBCLK and a supply voltage VDD. The fifth NAND gate 546 may receive an output of the fourth NAND gate 545 and the supply voltage VDD. Because the supply voltage VDD is a high-level signal, the fourth and fifth NAND gates 545 and 546 may operate as inverters. In the clock selector 531, the first and third divided clock signals ICLK and IBCLK may be outputted to the second comparator 532 through two NAND gates, respectively. The dummy delay 533 may delay the input clock signal FBCLK through the two NAND gates, thereby adjusting the point of time when the output of the clock selector 531 and the input clock signal FBCLK are inputted to the second comparator 532.

Figure 6A:
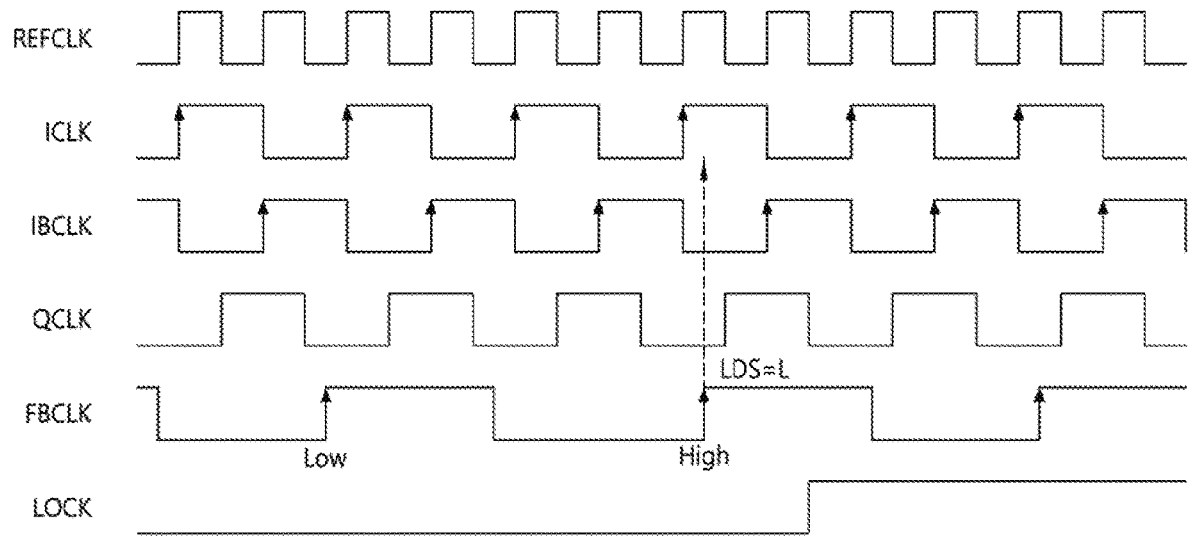
FIGS. 6A and 6B are timing diagrams illustrating operations of the phase detection circuit and the clock generation circuit in accordance with an embodiment.
Figure 6B:
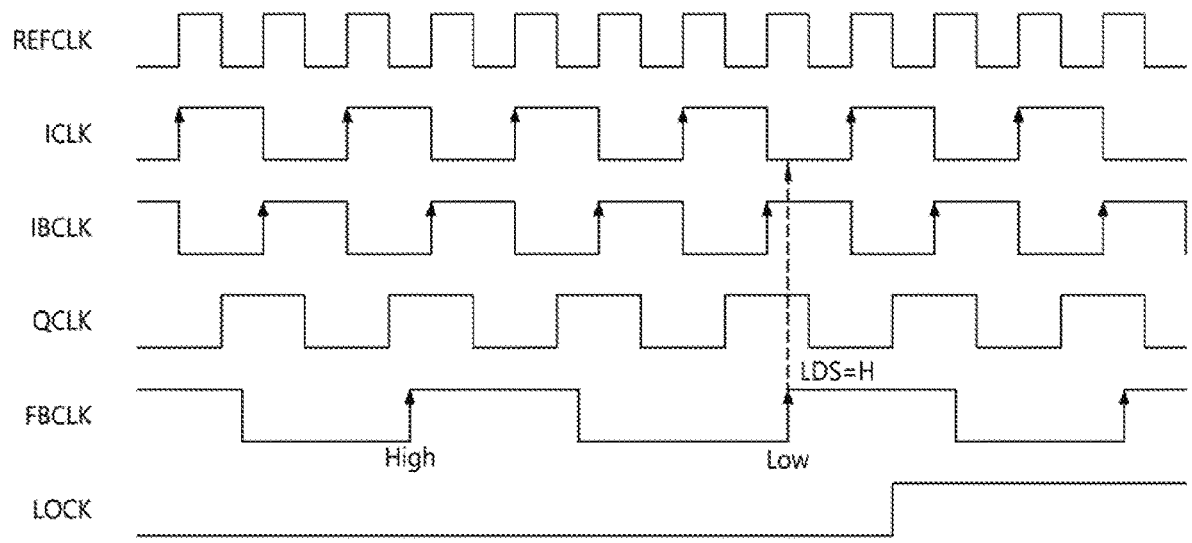

FIGS. 6A and 6B are timing diagrams illustrating the operations of the phase detection circuit 500 and the clock generation circuit 100 in accordance with an embodiment. Referring to FIGS. 1 and 5 to 6B, the operations of the phase detection circuit 500 and the clock generation circuit 100 in accordance with an embodiment will be described as follows. The clock divider 510 of the phase detection circuit 500 may generate the first divided clock signal ICLK, the second divided clock signal QCLK and the third divided clock signal IBCLK by dividing the reference clock signal REFCLK. The clock generation circuit 100 may perform the first delay locking operation, and the locking signal LOCK may be disabled. The phase detection circuit 500 may generate the phase detection signal PDOUT by comparing the phase of the feedback clock signal FBCLK to the phase of the first divided clock signal ICLK based on the disabled locking signal LOCK.

FIG. 6A shows that the phase detection circuit 500 detects that the first divided clock signal ICLK transitions from a low level to a high level at a rising edge of the feedback clock signal FBCLK, and performs the first delay locking operation. When the high-level transition of the first divided clock signal ICLK is detected during the first delay locking operation, harmonic locking might not occur. Because the level of the first divided clock signal ICLK is a low level at a first rising edge of the feedback clock signal FBCLK, the phase detection circuit 500 may generate the phase detection signal PDOUT having a low level. Because the level of the first divided clock signal ICLK is a high level at a second rising edge of the feedback clock signal FBCLK, the phase detection circuit 500 may generate the phase detection signal PDOUT having a high level. When the output of the phase detection circuit 500 changes from a low level to a high level, the delay line controller 150 may enable the locking signal LOCK. Just before the locking signal LOCK is enabled, the select signal generator 520 may output the level of the second divided clock signal QLCK, which lags behind the first divided clock signal ICLK by the unit phase, as the level decision signal LDS at a rising edge of the feedback clock signal FBCLK. Thus, the select signal generator 520 may output the level decision signal LDS having a low level. When the locking signal LOCK is enabled, the select signal generator 520 may output the select signal SEL having a high level based on the level decision signal LDS. The clock selector 531 may output the first divided clock signal ICLK to the second comparator 532 based on the select signal SEL having a high level. Therefore, as the second comparator 532 generates the phase detection signal PDOUT by comparing the phase of the first divided clock signal ICLK to the phase of the feedback clock signal FBCLK, the second delay locking operation of the clock generation circuit 100 may be performed.

FIG. 6B shows that the phase detection circuit 500 detects that the first divided clock signal ICLK transitions from a high level to a low level at a rising edge of the feedback clock signal FBCLK, and performs the first delay locking operation. When the low-level transition of the first divided clock signal ICLK is detected during the first delay locking operation, harmonic locking may occur. That is, when the phase detection circuit 500 performs the second delay locking operation by comparing the phase of the first divided clock signal ICLK to the phase of the feedback clock signal FBCLK after the first delay locking operation is completed, the harmonic locking may occur while a rising edge of the feedback clock signal FBCLK is synchronized with a rising edge of the reference clock signal REFCLK in a different cycle from a normal cycle. Because the level of the first divided clock signal ICLK is a high level at a first rising edge of the feedback clock signal FBCLK, the phase detection circuit 500 may generate the phase detection signal PDOUT having a high level. Because the level of the first divided clock signal ICLK is a low level at a second rising edge of the feedback clock signal FBCLK, the phase detection circuit 500 may generate the phase detection signal PDOUT having a low level. When the output of the phase detection circuit 500 changes from a high level to a low level, the delay line controller 150 may enable the locking signal LOCK. Just before the locking signal LOCK is enabled, the select signal generator 520 may output the level of the second divided clock signal QLCK, which lags behind the first divided clock signal ICLK by the unit phase, as the level decision signal LDS at a rising edge of the feedback clock signal FBCLK. Therefore, the select signal generator 520 may output the level decision signal LDS having a high level. When the locking signal LOCK is enabled, the select signal generator 520 may output the select signal SEL having a low level based on the level decision signal LDS. The clock selector 531 may output the third divided clock signal IBCLK to the second comparator 532 based on the select signal SEL having a low level. Therefore, as the second comparator 532 generates the phase detection signal PDOUT by comparing the phase of the third divided clock signal IBCLK to the phase of the feedback clock signal FBCLK, the second delay locking operation may be performed. As the phases of the third divided clock signal IBCLK and the feedback clock signal FBCLK are compared to perform the second delay locking operation, a rising edge of the reference clock signal REFCLK in a normal cycle may be synchronized with a rising edge of the feedback clock signal FBCLK.

Figure 7:
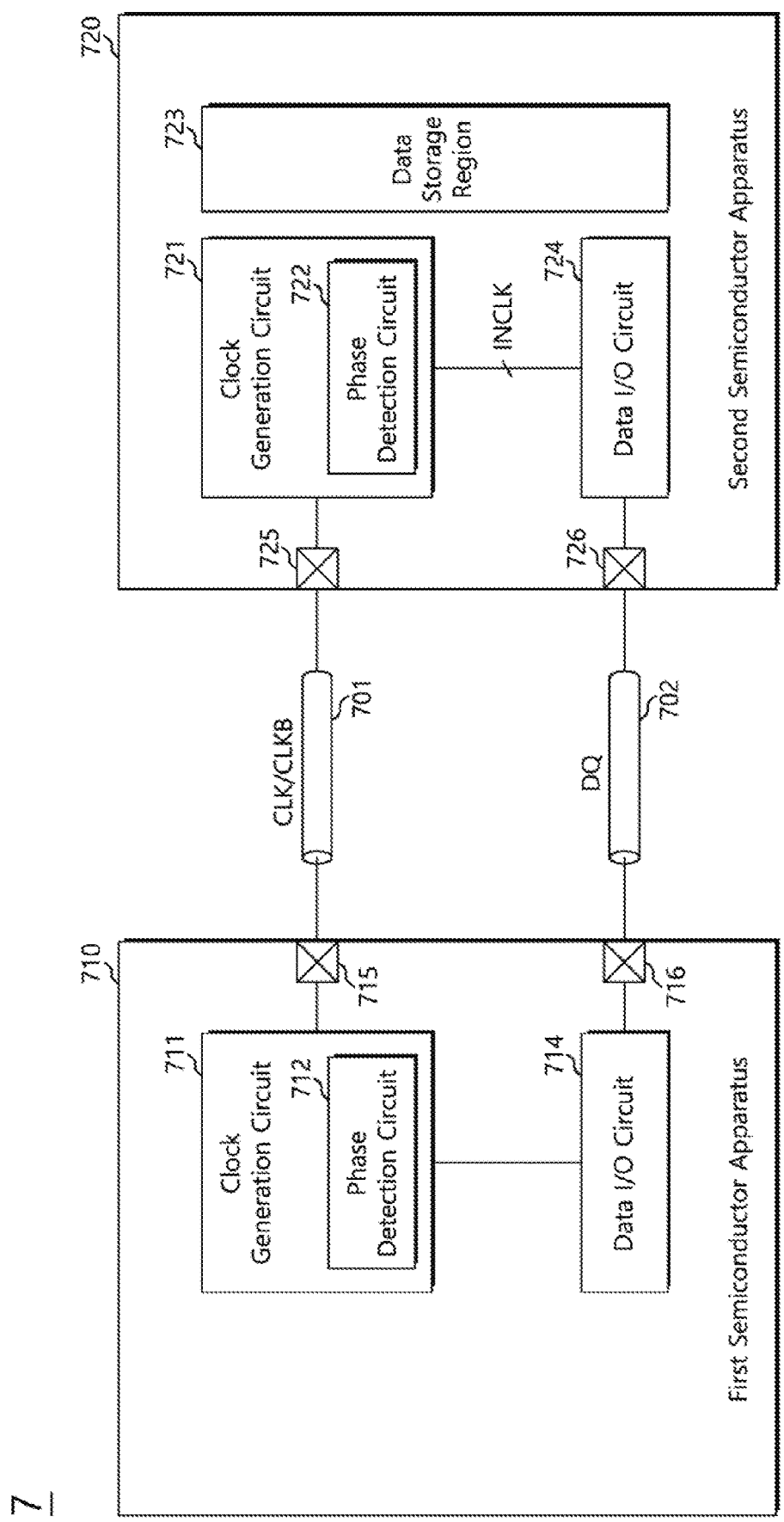
FIG. 7 illustrates a configuration of a semiconductor system in accordance with an embodiment.

FIG. 7 illustrates a configuration of a semiconductor system 7 in accordance with an embodiment. In FIG. 7, the semiconductor system 7 may include a first semiconductor apparatus 710 and a second semiconductor apparatus 720. The first semiconductor apparatus 710 may provide various control signals required for operating the second semiconductor apparatus 720. The first semiconductor apparatus 710 may include various types of apparatuses. For example, the first semiconductor apparatus 710 may be a host device such as a central processing unit (CPU), graphic processing unit (GPU), multi-media processor (MMP), digital signal processor, application processor (AP) or memory controller. The second semiconductor apparatus 720 may be a memory device, for example, and the memory device may include a volatile memory and a nonvolatile memory. Examples of the volatile memory may include an SRAM (Static RAM), DRAM (Dynamic RAM) and SDRAM (Synchronous DRAM), and the nonvolatile memory may include a ROM (Read Only Memory), PROM (Programmable ROM), EEPROM (Electrically Erasable and Programmable ROM), EPROM (Electrically Programmable ROM), flash memory, PRAM (Phase change RAM), MRAM (Magnetic RAM), RRAM (Resistive RAM), FRAM (Ferroelectric RAM) and the like.

The first and second semiconductor apparatuses 710 and 720 may transfer data to perform data communication. The first semiconductor apparatus 710 may transfer the data to the second semiconductor apparatus 720 in synchronization with a clock signal. Similarly, the second semiconductor apparatus 720 may transfer the data to the first semiconductor apparatus 710 in synchronization with the clock signal. The second semiconductor apparatus 720 may be coupled to the first semiconductor apparatus 710 through a plurality of buses. The plurality of buses 101 may be signal transfer paths, links or channels for transferring a signal. The plurality of buses may include a clock bus 701, a data bus 702 and the like. The clock bus 701 may be a one-way bus, and the data bus 702 may be a two-way bus. The second semiconductor apparatus 720 may be coupled to the first semiconductor apparatus 710 through the clock bus 701, and receive a system clock signal CLK through the clock bus 701. The system clock signal CLK may be transferred as a single ended signal, or transferred as a differential signal with a complementary signal CLKB. The second semiconductor apparatus 720 may be coupled to the first semiconductor apparatus 710 through the data bus 702, and receive data DQ from the first semiconductor apparatus 710 or transfer the data DQ to the first semiconductor apparatus 710 through the data bus 702. Although not illustrated, the semiconductor system 7 may further include a command address bus. The command address bus may be a one-way bus. The first semiconductor apparatus 710 may transfer a command address signal to the second semiconductor apparatus 720 through the command address bus.

The first semiconductor apparatus 710 may include a clock generation circuit 711 and a data I/O circuit 714. The clock generation circuit 711 may generate the system clock signal CLK. The clock generation circuit 711 may include a PLL circuit and/or a DLL circuit. The clock generation circuit 711 may adjust the phase of the system clock signal CLK by comparing the phase of a reference clock signal to the phase of a feedback clock signal. The clock generation circuit 711 may include a phase detection circuit 712 to compare the phases of the reference clock signal and the feedback clock signal. The clock generation circuit 100 illustrated in FIG. 1 may be applied as the clock generation circuit 711. The phase detection circuits 200 and 500 illustrated in FIGS. 2 and 5 may be applied as the phase detection circuit 712. The clock generation circuit 711 may be coupled to the clock bus 701 through a clock pad 715. The clock generation circuit 711 may provide the system clock signal CLK to the second semiconductor apparatus 720 through the clock bus 701. The clock generation circuit 711 may provide the system clock signal CLK to the data I/O circuit 714.

The data I/O circuit 714 may be coupled to the data bus 702 through a data pad 716. The data I/O circuit 714 may synchronize internal data of the first semiconductor apparatus 710 with the system clock signal CLK, and output the synchronized data to the data bus 702. The data outputted from the data I/O circuit 714 may be transferred as the data DQ to the second semiconductor apparatus 720 through the data pad 716 and the data bus 702. The data I/O circuit 714 may receive the data transferred from the second semiconductor apparatus 720 through the data bus 702, and generate the internal data of the first semiconductor apparatus 710 from the received data.

The second semiconductor apparatus 720 may include a clock generation circuit 721, a data storage area 723 and a data I/O circuit 724. The clock generation circuit 721 may be coupled to the clock bus 701 through a clock pad 725. The clock generation circuit 721 may receive the system clock signal CLK through the clock bus 701, and generate an internal clock signal INCLK. The clock generation circuit 721 may include a PLL circuit and/or a DLL circuit. The clock generation circuit 721 may adjust the phase of the internal clock signal INCLK by comparing the phase of the reference clock signal to the phase of the feedback clock signal. The clock generation circuit 721 may include a phase detection circuit 722 to compare the phases of the reference clock signal and the feedback clock signal. The clock generation circuit 100 illustrated in FIG. 1 may be applied as the clock generation circuit 721. The phase detection circuits 200 and 500 illustrated in FIGS. 2 and 5 may be applied as the phase detection circuit 722.

The data storage area 723 may be a memory cell array including a plurality of memory cells. The data storage area 723 may include a plurality of bit lines, a plurality of word lines, and a plurality of memory cells coupled to the respective intersections between the plurality of bit lines and the plurality of word lines. The plurality of memory cells may include one or more of a volatile memory cell and a nonvolatile memory cell.

The data I/O circuit 724 may be coupled to the data bus 702 through a data pad 726, and coupled to the data storage area 723. The data I/O circuit 724 may receive the internal clock signal INCLK from the clock generation circuit 721. The data I/O circuit 724 may synchronize data outputted from the data storage area 723 with the internal clock signal INCLK, and output the synchronized data to the data bus 702. The data outputted from the data I/O circuit 724 may be transferred as the data DQ to the first semiconductor apparatus 710. The data I/O circuit 724 may receive the data DQ transferred from the first semiconductor apparatus 710 through the data bus 702. The data I/O circuit 724 may store the received data in the data storage area 723.

While various embodiments have been described above, it will be understood to those skilled in the art that the embodiments described are examples only. Accordingly, the phase detection circuit and the clock generation circuit described herein should not be limited based on the described embodiments.

What is claimed is:

1. A phase detection circuit comprising:
   a clock divider configured to generate a first divided clock signal, a second divided clock signal and a third divided clock signal by dividing a reference clock signal;
   a select signal generator configured to generate a select signal by comparing the second divided clock signal and an input clock signal based on a locking signal; and
   a phase detector configured to generate a phase detection signal by comparing the phase of the first divided clock signal to the phase of the input clock signal when the select signal is at a first level, and generate the phase detection signal by comparing the phase of the third divided clock signal to the phase of the input clock signal when the select signal is at a second level.

2. The phase detection circuit according to claim 1, wherein the second divided clock signal has a phase corresponding to substantially the middle of a phase difference between the first and third divided clock signals.

3. The phase detection circuit according to claim 1, wherein the select signal generator generates the select signal comprising the first level when the lock signal is disabled.

4. The phase detection circuit according to claim 1, wherein when the lock signal is enabled, the select signal generator generates the select signal by comparing the phase of the second divided clock signal to the phase of the input clock signal.

5. The phase detection circuit according to claim 1, wherein the select signal generator comprises:
   a first gating unit configured to output the second divided clock signal based on the locking signal;
   a second gating unit configured to output the input clock signal based on the locking signal;
   a comparator configured to generate a level decision signal by comparing the signals outputted from the first and second gating units; and
   a third gating unit configured to generate the select signal based on the level decision signal and the locking signal.

6. The phase detection circuit according to claim 1, wherein the phase detector comprises:
   a clock selector configured to output one of the first and third divided clock signals based on the select signal; and
   a comparator configured to generate the phase detection signal by comparing the output of the clock selector to the input clock signal.

7. The phase detection circuit according to claim 1, wherein the phase detector further comprises a dummy delay configured to delay the input clock signal, wherein the dummy delay has a delay amount corresponding to a delay amount required for the clock selector to select and output one of the first and third divided clock signals.

8. A clock generation circuit comprising a phase detection circuit configured to generate an output clock signal by delaying a reference clock signal, and generate a phase detection signal by detecting the phase of the reference clock signal to the phase of a feedback clock signal generated from the output clock signal in order to change a delay amount of the output clock signal, wherein the phase detection circuit comprises:

a clock divider configured to generate a first divided clock signal, a second divided clock signal and a third divided clock signal by dividing the reference clock signal;

a select signal generator configured to generate a select signal by comparing the phase of the second divided clock signal to the phase of a feedback clock signal based on a locking signal; and a phase detector configured to generate a phase detection signal by comparing the phase of one of the first and third divided clock signals to the phase of the feedback clock signal based on the select signal.

9. The clock generation circuit according to claim 8, wherein the second divided clock signal has a phase corresponding to substantially the middle of a phase difference between the first and third divided clock signals.

10. The clock generation circuit according to claim 8, wherein the select signal generator generates the select signal comprising a first level when the lock signal is disabled, and generates the select signal comprising one of the first level and a second level by comparing the phase of the second divided clock signal to the phase of the input clock signal when the locking signal is enabled.

11. The clock generation circuit according to claim 8, wherein the select signal generator comprises:

a first gating unit configured to output the second divided clock signal based on the locking signal;

a second gating unit configured to output the input clock signal based on the locking signal;

a comparator configured to generate a level decision signal by comparing the signals outputted from the first and second gating units; and a third gating unit configured to generate the select signal based on the level decision signal and the locking signal.

12. The clock generation circuit according to claim 8, wherein the phase detector generates the phase detection signal by comparing the phase of the first divided clock signal to the phase of the feedback clock signal when the select signal is at a first level, and generates the phase detection signal by comparing the phase of the third divided clock signal to the phase of the feedback clock signal when the select signal is at a second level.

13. The clock generation circuit according to claim 8, wherein the phase detector comprises:

a clock selector configured to output one of the first and third divided clock signals based on the select signal; and a comparator configured to generate the phase detection signal by comparing the output of the clock selector to the feedback clock signal.

14. The clock generation circuit according to claim 13, wherein the phase detector further comprises a dummy delay configured to delay the feedback clock signal, wherein the dummy delay has a delay amount corresponding to a delay amount required for the clock selector to select and output one of the first and third divided clock signals.

15. The clock generation circuit according to claim 8, further comprising:

a delay line configured to generate the output clock signal by delaying the reference clock signal based on a delay control signal;

a clock dividing circuit configured to divide the output clock signal;

a replica configured to generate the feedback clock signal by delaying an output of the clock dividing circuit by a preset delay amount; and a delay line controller configured to generate the delay control signal and the locking signal based on the phase detection signal.

\* \* \* \* \*